United States Patent [19]
Ripley et al.

[11] 3,937,952
[45] Feb. 10, 1976

[54] KEYBOARD AND SWITCHES FOR KEYBOARDS

[75] Inventors: Lionel George Ripley, Lewes; Richard Lawrence Grimsdale, Brighton, both of England

[73] Assignee: National Research Development Corporation, London, England

[22] Filed: Dec. 30, 1974

[21] Appl. No.: 537,546

Related U.S. Application Data

[63] Continuation of Ser. No. 399,618, Sept. 21, 1973, abandoned.

[30] Foreign Application Priority Data

Sept. 22, 1972 United Kingdom............... 43965/72

[52] U.S. Cl. ................. 250/227; 250/578; 250/209; 340/365 P
[51] Int. Cl.² ............................................ G02B 5/14
[58] Field of Search ........... 250/227, 221, 229, 568, 250/569, 578, 208, 209; 340/365 P, 380; 178/17 R, 17 A

[56] References Cited
UNITED STATES PATENTS

| | | | |
|---|---|---|---|
| 3,340,401 | 9/1967 | Young | 250/221 |
| 3,566,083 | 2/1971 | McMillin | 250/227 X |
| 3,603,982 | 9/1971 | Patti | 250/229 |
| 3,609,759 | 9/1971 | Teske | 340/365 P |
| 3,617,627 | 11/1971 | McLean | 178/17 R |
| 3,621,268 | 11/1971 | Friedrich et al. | 250/221 |
| 3,676,689 | 7/1972 | Knepper, Sr. | 340/380 X |
| 3,714,447 | 1/1973 | Jallais | 250/569 X |

*Primary Examiner*—Walter Stolwein
*Attorney, Agent, or Firm*—Oblon, Fisher, Spivak, McClelland & Maier

[57] ABSTRACT

A switch for use in a keyboard consists of an input light pipe, one or more output light pipes and means selectively operable to cause light to be reflected from the input light pipe into the output light pipes. The output light pipes are preferably connected to photodetectors which detect whether or not the switch is actuated by determining the amount of light incident thereon. When such a switch is to be used in a keyboard which is required to produce a coded output, one photodetector is provided for each digit of the code and output light pipes on the various switches are connected to the photodetectors in accordance with the code.

6 Claims, 9 Drawing Figures

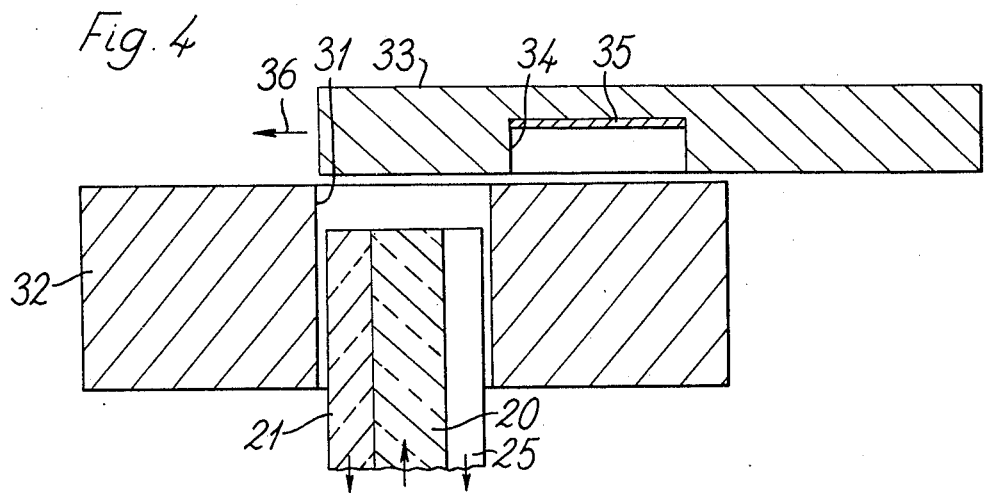
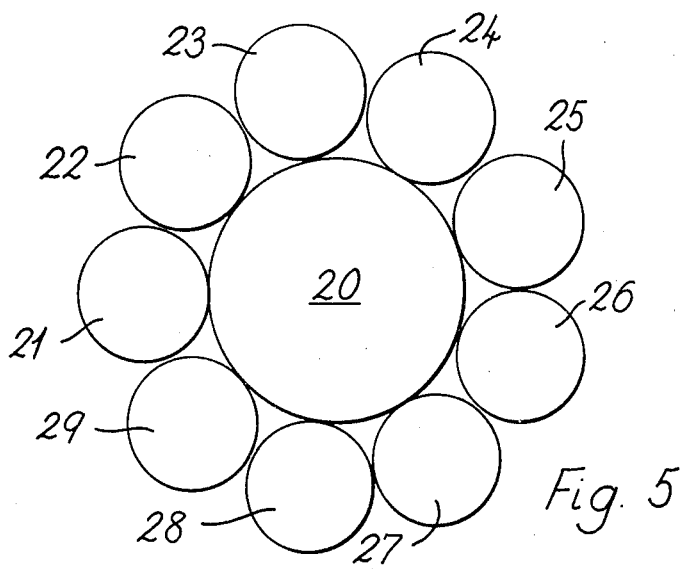

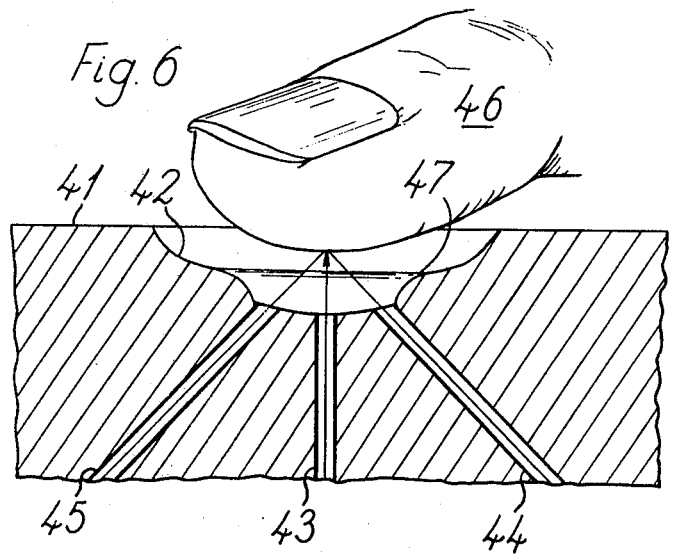
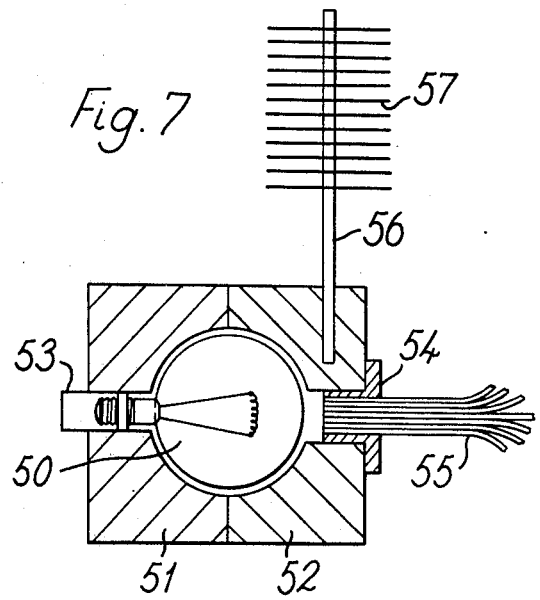

KEYBOARD AND SWITCHES FOR KEYBOARDS

This is a continuation, of application Ser. No. 399,618, filed Sept. 21, 1973, now abandoned.

This invention relates to switches and to keyboards employing such switches.

According to the invention, a switch comprises an input light pipe having a first end adapted to receive light from a light source, an output light pipe having a first end in proximity to a second end of said input light pipe, the arrangement being such that, in use, the amount of light from said first light pipe entering said second light pipe is variable between a first level when said switch is actuated and a second level when said switch is not actuated.

In one form of the invention, a reflective surface forms part of a push button whereby the switch is actuated. In another form of the invention, the arrangement is such that the finger of the operator serves as the reflective surface.

A fuller understanding of the present invention may be had from the following description, by way of example, with reference to the accompanying drawings, in which:

FIG. 4 is a sectional view of another form of switch in accordance with the invention;

FIG. 5 is a plan view of the switch shown in FIG. 4;

FIG. 6 is a sectional view of a further form of switch in accordance with the invention;

FIG. 7 is a sectional view of a light source for use with the switches described with reference to FIGS. 1 to 6;

Figure 1:
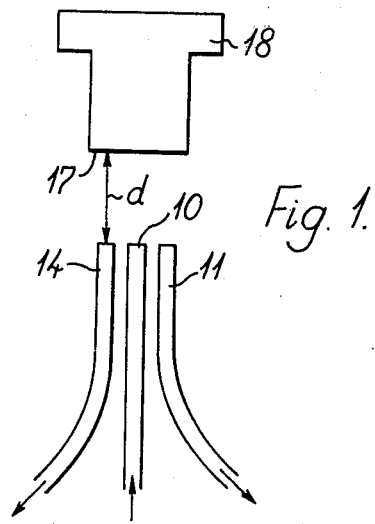
FIG. 1 is a sectional view of a switch in accordance with the invention.
Figure 2:
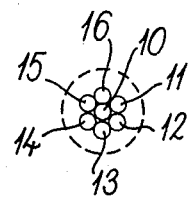
FIG. 2 is a plan view of part of the switch shown in FIG. 1.

Referring to FIGS. 1 and 2, a switch in accordance with the invention comprises a bundle of light pipes consisting of a central light pipe 10 surrounded by six peripheral light pipes 11 to 16. One end of each of the light pipes 10 to 16 is disposed in a common plane confronting a reflective surface 17 formed on the movable member 18 of the switch which takes the form of a push button which is spring-biased away from the light pipes. The central light pipe 10 is connected to a light source (not shown) and the peripheral light pipes 11 to 16 are connected to one or more photodetectors (not shown). In use, light from the central light pipe 10 is reflected by the surface 17 on to the co-planar ends of the peripheral light pipes 11 to 16 and thence directed to the photodetector or photodetectors.

Figure 3:
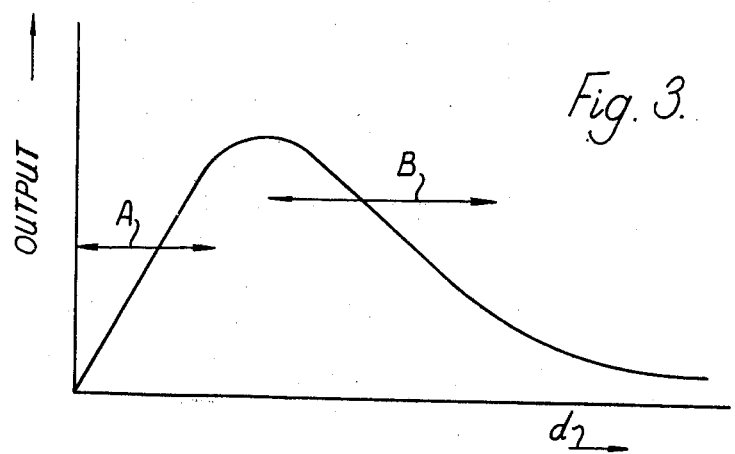
FIG. 3 is a graph illustrating the variation in the output of the detector of the switch shown in 1 with position of the reflecting surface thereof.

Referring to FIG. 3, which shows the variation of output from the peripheral light pipes 11 to 16 with distance $d$ between the coplanar ends of the light pipes 10 to 16 and the surface 17, it will be seen that when $d = 0$, the output is zero since no light can escape from the pipe 10. Similarly, when $d$ approaches infinity, very little light is reflected back into the outer pipes. At some intermediate value of $d$ the maximum occurs. The movement of the push button 18 is limited by mechanical stops which can be set to allow travel either as indicated by the arrow A to cause interruption of the output light when the push button 18 is depressed, or as indicated by the arrow B which switches light on when the push button 18 is depressed. With the first alternative the co-planar ends of the light pipes 10 to 16 can themselves be used as one of the mechanical stops. It has been found that reliable detection can be obtained with movements of as little as 0.5 mm.

The surface 17 need not be flat.

With the embodiment of the invention illustrated in FIGS. 1 and 2, operation as illustrated by arrow B (FIG. 3), so that the light is switched on when the push button 18 is depressed, requires the push-button to have a relatively large length of travel. In some applications, particularly when the switch is to form part of a keyboard, the length of travel involved is ergonomically unacceptable. An ergonomically acceptable distance of travel can be obtained by operating as indicated by arrow A, so that depression of the push-button causes interruption of the output of light. This is satisfactory when one or more of the peripheral light pipes is connected to a photodetector exclusively associated with the particular switch. However, when, as will be explained hereinafter, light pipes from a number of switches are connected to each photodetector, operation as indicated by the arrow A would mean that when no switch is actuated, the photodetector would be fully illuminated and, on actuation of a switch, the photodetector would be required to detect a change in level of illumination from the condition when it is illuminated by all the light pipes to which it is coupled to the condition when it is illuminated by all but one of such light pipes. Satisfactory operation of such an arrangement would be critically dependent on various factors, such as the brightness of the light source, remaining accurately constant.

FIGS. 4 and 5 illustrate, an alternative form of switch in which depression of the push-button can be arranged to switch the light on without requiring an unacceptably large distance of travel for the moving part. This is achieved by arranging for the reflective surface to move laterally relative to the light pipes. Referring to FIG. 4, a bundle of light pipes consisting of a central light pipe 20 surrounded by nine peripheral light pipes 21 to 29 are each arranged with one end disposed in a common plane in a hole 31 in a metal block 32. A movable member 33 is disposed in contact with the block 32 confronting the ends of the light pipes 20 to 29 in the hole 31. The member 33 contains a recess 34 having the same cross-section as the hole 31 and having a reflective coating 35 on the face thereof confronting the block 32. The side walls of the recess 34 and the rest of the surface of the member 33 which confronts the block 32 are blackened. The movable member 33 is arranged to be slidable relative to the block 32 in the direction indicated by arrow 36 so as to bring the recess 34 into alignment with the hole 31. Thus, when the movable member 33 is in the position shown in FIG. 4, no light is reflected from the light pipe 20 into any of the peripheral light pipes 21 to 29. On the other hand, when the recess 34 is in alignment with the hole 31, light is reflected from the central light pipe 20 into all the peripheral light pipes 21 to 29. The slidable member 33 is springbiased into the position shown in FIG. 4.

Since both the ends of the light pipes 20 and 29 and the reflective surface 35 are recessed into the block 32 and the movable member 33 respectively, both are protected from damage due to scratching during the sliding movement.

It will be apparent that when the slidable member 33 is depressed, the light output from the various peripheral light pipes 21 to 29 do not rise to their maximum value simultaneously. In fact the light pipes 25 and 26 will produce their maximum output before any significant output is received from the light pipe 21. In order to prevent maloperation, the light pipe 21 is preferably used to produce a "ready" signal and logic circuitry provided to prevent any response being made to the depression of the slidable member 33 until such ready signal is received.

Referring particularly to FIG. 5, it will be seen that the diameter of the central light pipe 20 is much greater than that of the peripheral light pipes 21 to 29. This arrangement possesses the advantage that it is possible to group a greater number of peripheral light pipes round the central light pipe than was the case with the arrangement shown in FIG. 2 and that the greater diameter of the central light pipe 20 enables the level of illumination of the reflective surface to be higher. This is at the expense of increasing the overall diameter of the bundle of light pipes and thus also the distance of travel of the movable member 33. It should be realised that a bundle of light pipes as shown in FIG. 2 can be used with the switch illustrated in FIG. 4. Similarly, a bundle of light pipes as illustrated in FIG. 5 can be used with the switch shown in FIG. 1. Other bundlings can also be used. For example, with the switch shown in FIG. 5, arrangement of the light pipes in a straight row perpendicular to the direction of movement of the member 33 enables the distance of travel to be minimised.

FIG. 6 illustrates a further embodiment providing a key switch having no moving parts. The switch is formed in a block 41, which may form part of a control panel or keyboard and comprises a recess 42 of a size suitable to receive the finger tip of an operator. A central light pipe 43 and a plurality of peripheral light pipes, of which the light pipes 44 and 45 can be seen in FIG. 6, are embedded in the block 41, each having one end in the surface of the recess 42. The light pipe 43 is connected to a source of light and the peripheral light pipes such as 44 and 45 are connected to one or more photodetectors. In the absence of any reflecting surface in the vicinity of the recess 42, no light from the central light pipe 43 reaches the peripheral light pipes such as 44 and 45. However, if an operator's finger 46 is placed in the recess 42 as shown, light from the central light pipe 43 is reflected into the peripheral light pipes such as 44 and 45.

It will be realised that, if the finger 46 is allowed to actually come in contact with the end of the light pipe 43, this will prevent all light from emerging and consequently no light will be received by the peripheral light pipes such as 44 and 45. This would mean that, for each time an operator's finger is placed in the recess 42, two output signals would be received by the photodetectors, one as the finger approaches just prior to its making contact with the end of the light pipe 43 and the other as the finger as removed. It is therefore preferred to form the recess 42 with an annular shoulder 47 in order to prevent the finger of the operator from actually coming into contact with the light pipe 43.

FIG. 7 illustrates a light source suitable for use with any of the switches described above. One of the problems in providing a suitable light source is that the light pipes cannot withstand high temperatures. Referring to FIG. 7, a tungsten filament lamp 50 is enclosed within a block of metal, formed in two sections 51 and 52 to permit replacement of the lamp, and containing a recess of the same shape and slightly larger than the bulb of the lamp 50. A hole in the block 51 contains a lamp holder 53 and a hole in the block 52 accommodates a boss 54 in which are secured the ends of a bundle of light pipes 55. The light pipes forming the bundle 55 are the central light pipes 10, 20 or 43 of all the switches which are to be illuminated by the lamp 50. A heat pipe 56 has its lower end embedded in the section 52 close to the boss 54 and its upper end connected to a set of cooling fins 57. A heat pipe consists of a sealed tube containing a volatile liquid so that when a heat source is applied to one end and a heat sink to the other end, the liquid vapourises at the first mentioned end, rises to the other end within the tube where it condenses and then runs back as a liquid to the first mentioned end. Thus, the rate of transfer of heat depends primarily on the latent heat of vapourisation of the liquid rather than on its specific heat or on the thermal conductivity of the walls of the tube. A suitable heat pipe for use in the apparatus illustrated in FIG. 7 is manufactured by Jermyn Industries Limited.

If desired, one of the light pipes of the bundle 55 may be directly connected to a photodetector which is used to provide a feedback signal to maintain the lamp 50 at constant brightness.

With the key switch illustrated in FIG. 6, the peripheral light pipes 44 and 45 receive ambient illumination when the switch is not actuated by the presence of a finger. The ambient illumination produces either a d.c. output if it is due to daylight, or a signal modulated at twice the mains frequency (100 Hz in the case of the 50 Hz mains supply frequency in the United Kingdom) if it is due to mains-powered electric lighting. To enable the light from the central light pipe 43 to be distinguished from such ambient light, it is therefore preferably modulated with a different frequency. This can be readily done by supplying the lamp 50 from the mains supply via a half-wave rectifier so that the resulting light output is modulated at mains frequency.

Figure 8:
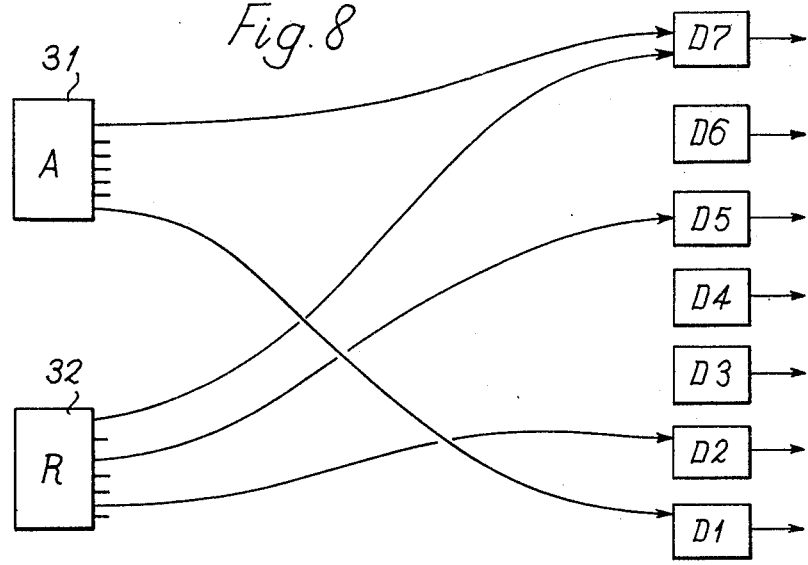
FIG. 8 is a schematic diagram illustrating how the switches described with reference to FIGS. 1 to 7 may be used in a keyboard to obtain a coded output.

FIG. 8 shows how the key swiches described above may be used to form a keyboard giving a seven-bit output in standard A.S.C.I.I. code. By way of example, the key 61 is shown as coded for letter 'A' and the key 62 for letter 'R'. Each of the key switches 61 and 62 has seven peripheral light pipes each of which is associated with a respective one of detectors D1 to D7. Each of the seven detectors D1 to D7 corresponds to a respective bit of the A.S.C.I.I. code. Those light pipes connected to a detector for which the corresponding bit in the code is a 1 are actually connected to their detectors. Light pipes corresponding to digit 0 are left disconnected. The connections for the key switches 61 and 62 are shown in the following tables:

| Detector | D1 | D2 | D3 | D4 | D5 | D6 | D7 |
|---|---|---|---|---|---|---|---|
| A | 1 | 0 | 0 | 0 | 0 | 0 | 1 |
| R | 0 | 1 | 0 | 0 | 1 | 0 | 1 |

Thus, the key switch 61 has only its first and seventh light pipes connected to detectors while the key switch 62 has its second, fifth and seventh light pipes connected to detectors.

For a complete keyboard, each detector must be capable of receiving a large number of light pipes, up to one light pipe for each key switch. One way of doing this is to use a lens to focus all such outputs on to the relatively small area of a single detector. An alternative is to use a plurality of cells for each detector, each receiving only about a dozen light pipes, and electrically combining their outputs.

Figure 9:
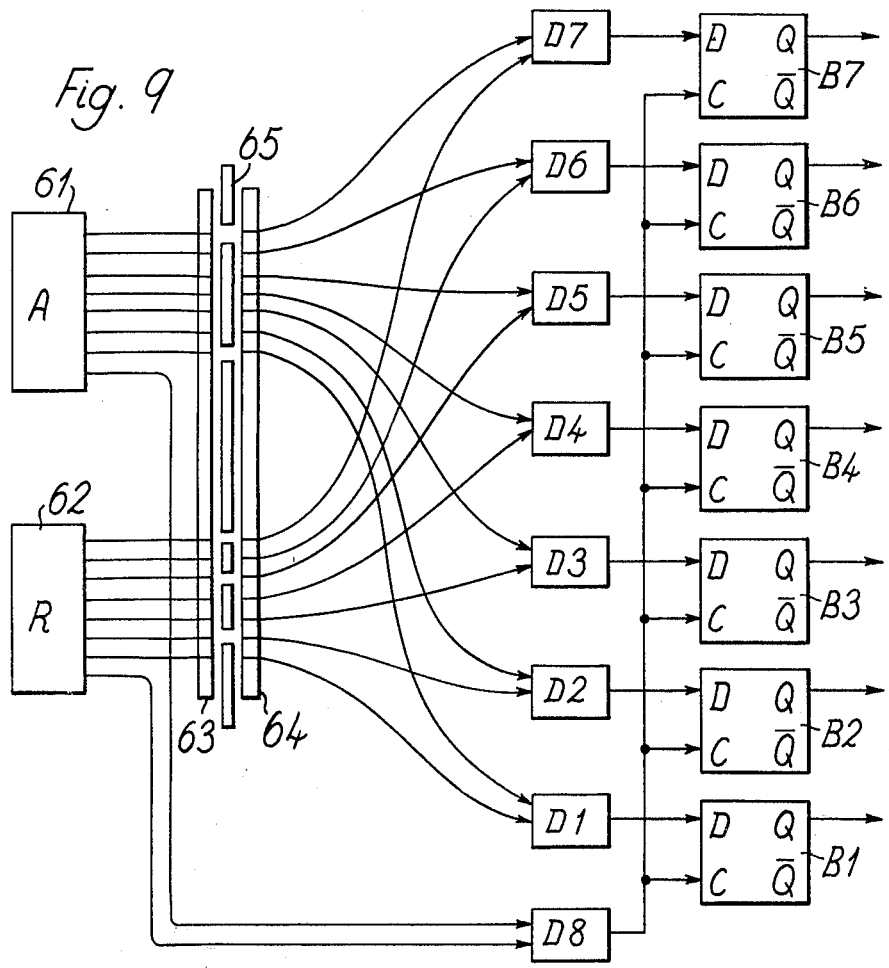
FIG. 9 is a schematic diagram similar to FIG. 7 illustrating modification whereby the code of the coded output can readily be varied.

FIG. 9 illustrates a modification of the arrangement shown in FIG. 8 which enables the seven bit code used to be changed readily. As in FIG. 8, the keys 61 and 62 representing the letters A and R are shown each having seven peripheral light pipes each associated with respective detectors D1 to D7. Between their respective key switches and detectors, all the light pipes pass through two parallel plates 63 and 64 and the section of each light pipe between the plates 63 and 64 is removed. The plates 63 and 64 are closely spaced so that the sections of each light pipe on opposite sides of the gap between the two gaps 63 and 64 are held accurately in alignment so that a substantial proportion of the light from the sections connected to the key switch is picked up by the corresponding sections connected to the detectors and a negligible amount is picked up by adjacent light pipes. A coding card 65 is inserted between the plates 63 and 64. The card 65 has holes aligned with those of the light pipes which are to be connected to detectors in accordance with the required code. The card 65 is shown as allowing connection in accordance with the A.S.C.I.I. code but it will be appreciated that it may readily be replaced by another card having punchings in accordance with a different code.

FIG. 9 also illustrates the logic required to cater for the ready signal when switches of the type illustrated in FIG. 4 and 5 are used. The "ready" output light pipes from each switch are connected to an additional detector D8. The outputs of the detectors D1 to D7 are connected to the D inputs of respective Dtype bistables B1 to B7. The output of the eighth photodetector D8 is connected to the clock inputs of the bistables B1 to B7 so that they can change state only when a ready signal has been received. This arrangement may, of course, also be applied to the permanently coded system illustrated in FIG. 8.

When switches of the type illustrated in FIGS. 4 and 5 are used in the manner described with reference to FIG. 9, it may be arranged that there are two spare light pipes on each switch. Preferably, the light pipes 22 and 29 (FIG. 5) immediately adjacent to the light pipe 21 which produces the ready signal are left unused so as to reduce the chance of a ready signal being produced before a photodetector connected to one of the other light pipes has produced a sufficient output to operate its associated bistable.

The photodetectors may be of type IPL 15 manufactured by Integrated Photomatrix Limited.

We claim:

1. A keyboard comprising:
   a light source,
   a plurality of optical switches,
   a plurality of photodetectors,
   a plurality of output light pipes for each switch selectively connecting the switch to a plurality of photodetectors,
   one input light pipe for each switch being connected to the light source,
   each optical switch comprising light conduction means to transmit light from the input light pipe to the plurality of output light pipes,
   the amount of light from each input light pipe entering the light conduction means for transmission to the plurality of output light pipes being variable between a first level when the switch is actuated and a second level when the switch is not actuated,
   each plurality of output light pipes being connected to a different combination of photodetectors which generate a signal consisting of a different multibit binary code for each switch.

2. A keyboard as claimed in claim 1 wherein the end of the input light pipe for each switch is disposed with respect to the light conduction means for each switch so that when the finger of a user is disposed in a predetermined position light from the input light pipe is reflected into the light conduction means.

3. A keyboard as claimed in claim 1 comprising an operating member for each switch having a reflective surface moveable between a position in which the amount of light entering the light conduction means is at a first level and a position when the amount of light entering the light conduction means is at a second level.

4. A keyboard as claimed in claim 3 wherein the operating member of each switch is moveable to vary the distance between the reflective surface and the end of the input light pipe thereof.

5. A keyboard as claimed in claim 3 wherein the operating member of each switch is moveable to move the reflective surface into and out of alignment wiht the end of the input light pipe thereof.

6. A keyboard as claimed in claim 1 wherein the selective connection between the plurality of output light pipes for each switch and the plurality of photodetectors comprises the division of the output light pipes into two portions having confronting spaced apart end faces with a coding member disposed between selected end faces to prevent passage of light between the selected end faces so that the code may be easily changed by changing the position of the coding member.

* * * * *